(12) United States Patent
Leslie et al.

(10) Patent No.: US 7,847,600 B2
(45) Date of Patent: Dec. 7, 2010

(54) TRACK AND HOLD CIRCUIT

(75) Inventors: Thomas Leslie, Clay Coton (GB);
Antonio David Sebastio, Northampton (GB); Bhajan Singh, Birmingham (GB)

(73) Assignee: Texas Instruments Incorporated, Dallas, TX (US)

( * ) Notice: Subject to any disclaimer, the term of this patent is extended or adjusted under 35 U.S.C. 154(b) by 45 days.

(21) Appl. No.: 12/198,355

(22) Filed: Aug. 26, 2008

(65) Prior Publication Data

US 2009/0066370 A1  Mar. 12, 2009

Related U.S. Application Data

(60) Provisional application No. 61/016,999, filed on Sep. 10, 2007.

(30) Foreign Application Priority Data

Sep. 10, 2007  (GB) .................. 0717567.2

(51) Int. Cl.
*G11C 27/02* (2006.01)
*H03K 5/00* (2006.01)
*H03K 17/00* (2006.01)

(52) U.S. Cl. ............. 327/94; 327/91; 327/92; 327/93; 327/95; 327/96

(58) Field of Classification Search ............ 327/91, 327/94

See application file for complete search history.

(56) References Cited

U.S. PATENT DOCUMENTS

| | | | |
|---|---|---|---|
| 4,922,452 A | 5/1990 | Larsen et al. | |
| 5,172,019 A | 12/1992 | Naylor et al. | |
| 5,982,205 A * | 11/1999 | Vallancourt | 327/94 |
| 6,288,604 B1 | 9/2001 | Shih et al. | |
| 6,836,158 B2 | 12/2004 | Devries et al. | |
| 7,167,029 B2 | 1/2007 | Soeraasen | |
| 2007/0024368 A1 | 2/2007 | Abdelatty Ali | |
| 2008/0054951 A1* | 3/2008 | Singh et al. | 327/94 |

* cited by examiner

*Primary Examiner*—Lincoln Donovan
*Assistant Examiner*—John W Poos
(74) *Attorney, Agent, or Firm*—Dawn V. Stephens; Wade James Brady, III; Frederick J. Telecky, Jr.

(57) ABSTRACT

Methods and apparatus are disclosed to track and hold a voltage. An example track and hold circuit comprises a first electronic switch, a second electronic switch, and a current mode logic amplifier.

6 Claims, 5 Drawing Sheets

US 7,847,600 B2

TRACK AND HOLD CIRCUIT

CLAIM OF PRIORITY

This application claims priority under 35 U.S.C. 119(a) to Great Britain Patent Application No. 0717567.2 filed Sep. 10, 2007 and 35 U.S.C. 119(e)(1) to U.S. Provisional Application No. 61/016,999 filed Dec. 27, 2007.

FIELD OF THE DISCLOSURE

This disclosure relates generally to capturing electrical signal values, and, more particularly, to methods and apparatus to track and hold a voltage.

BACKGROUND

Track and hold circuits are used for capturing and holding voltage amplitude values of a continuous time input signal at predetermined times. In a typical application, a track and hold circuit holds voltage values at predetermined times or intervals and an analog-to-digital converter samples the held voltage values at the output of the track and hold circuit and converts the held values into digital signals. Conceptually, a track and hold circuit includes a switch and an amplitude storage device. In the track mode, the switch is closed thereby coupling the input signal to the storage device, and thereby allowing the amplitude storage device to follow or track the input signal. In the hold mode, the switch is open, which isolates the storage device from the input signal, and allows the storage device to hold constant the amplitude value of the input signal at the time the switch was opened.

FIG. 1 is schematic illustration of a known track and hold circuit 5. The track and hold circuit 5 includes an electronic switch 10, a hold capacitor 20, which functions as the amplitude storage device, and a buffer amplifier 30. In the track and hold circuit 5, it is the voltage amplitude of the input signal 40 that is tracked and held. A HOLD signal 50 controls the electronic switch 10. The HOLD signal 50 opens the electronic switch 10, placing the track and hold circuit 5 in a hold mode, in which the voltage of the input signal 40 at the time the electronic switch 10 opened is held by the hold capacitor 20. The HOLD signal 50 is also used to close the electronic switch 10, placing the track and hold circuit 5 in a track mode, in which the voltage on the hold capacitor 20 continuously tracks the voltage of the input signal 40. The buffer amplifier 30 prevents external circuitry that may be coupled to the output 60 of the track and hold circuit 5 from discharging the hold capacitor 20.

The rate at which the track and hold circuit 5 is alternated between the track and hold modes is called the sample rate. A time required to charge the hold capacitor 20 to the voltage of the input signal 40 during the track mode places a limit on the maximum sample rate of the track and hold circuit 5. Reducing the time required to charge the hold capacitor 20 increases the sample rate limit. The time required to charge the hold capacitor 20 may be reduced by decreasing the capacitance value of the hold capacitor 20 and/or by decreasing the residual resistance (ON resistance) of the electronic switch 10 (e.g., by using a lower ON resistance switch for the electronic switch 10. Other constraints imposed by the implementation technology used for the components of the track and hold circuit 5 place lower bounds on the values of the capacitance of the hold capacitor 20 and the ON resistance of the electronic switch 10.

Presently, silicon-based complementary metal-oxide-semiconductor (CMOS) technology is the least costly integrated circuit technology. When the required sample rate of the track and hold circuit exceeds somewhere about 2 gigahertz (GHz) to 5 GHz, imperfections in CMOS technology has limited its application. One way around the sample rate limitation of CMOS has been to employ a faster integrated circuit technology, for example, using technologies such as gallium arsenide (GaAs), silicon-germanium (SiGe), and indium phosphide/gallium arsenide (InP/GaAs). Work in this area has yielded faster track and hold circuits, but circuits fabricated using these technologies come at a higher cost.

FIG. 2 is a schematic diagram of a known track and hold circuit 100, which is referred to as a single-ended common-drain based track and hold circuit. In the circuit 100, an input signal is coupled to a source follower circuit including an n-type metal oxide semiconductor (NMOS) input device 102 and an NMOS bias device 104. A supply voltage (Vsupply) is coupled to the NMOS input device 102 and a bias signal is provided to a gate of the NMOS bias device 104.

In operation, the source follower formed by the devices 102 and 104 steps down the voltage provided at the gate of the NMOS input device 102 and provides the stepped-down voltage to an NMOS switching device 106, the output of which is coupled to an NMOS dummy switch 108, which provides charge cancellation functionality. The signals designated as hold bar and hold that are provided to the gates of the devices 106 and 108 control whether the stepped-down voltage provided by the source follower of devices 102 and 104 is tracked or held. When the stepped-down voltage is not held, the hold bar and hold signals control the devices 106 and 108 to pass the stepped-down voltage to a gate of a p-type metal oxide semiconductor (PMOS) output device 110. The PMOS output device 110 operates in conjunction with a PMOS bias device 112 to amplify the stepped-down voltage provided from the device 108 back to the level of the original input signal provided at the gate of the NMOS input device 102.

In contrast, when the stepped-down voltage is to be held, the hold bar and hold signals control the devices 106 and 108 to disconnect the stepped-down voltage from the gate of the device 110. When the stepped down voltage from the gate of the device 110 is disconnected from the device 110, the device 110 holds the prior value that it received, owning to capacitance of the device 110. Accordingly, it is that prior, or held, value of the stepped-down voltage that is stepped up and output.

As will be readily appreciated by those having ordinary skill in the art, the circuit of FIG. 2 is a single-ended circuit. For the purpose of eliminating common mode noise, differential circuits are commonly used, wherein an input signal and its complement are each coupled to a separate branch of a circuit and, therefore, noise common to both branches of the circuit may be eliminated. It is known to use two separate instances of the circuit in FIG. 2 to construct a pseudo-differential circuit. However, because the two circuits are physically separate, there is a reduction in the amount of common mode noise that is eliminated through a pseudo-differential circuit.

BRIEF DESCRIPTION OF THE DRAWINGS

Wherever possible, the same reference numbers will be used throughout the drawing(s) and accompanying written description to refer to the same or similar parts.

DETAILED DESCRIPTION

Figure 1:
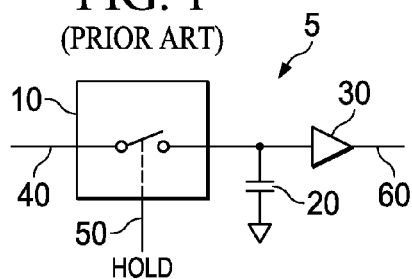
FIG. 1 is schematic illustration of a known track and hold circuit.
Figure 2:
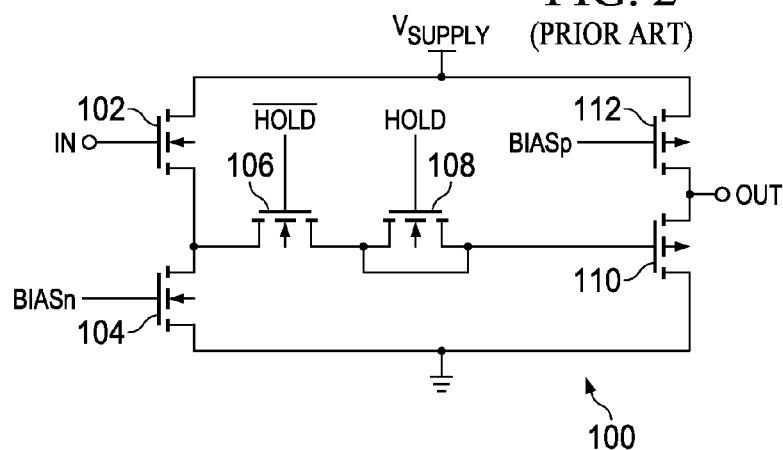
FIG. 2 is a schematic illustration of a known single-ended common-drain track and hold circuit.
Figure 3:
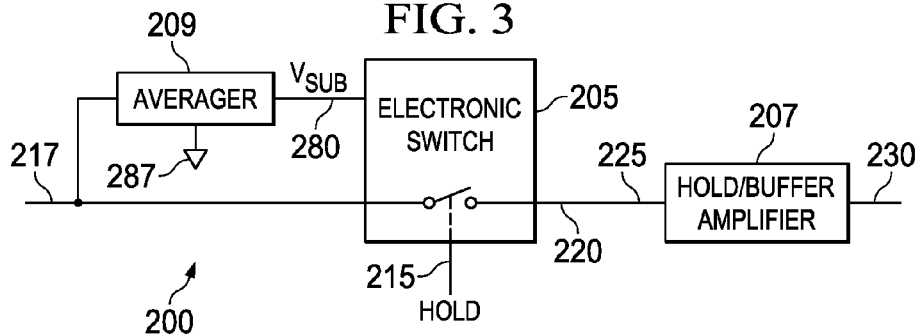
FIG. 3 is a schematic illustration of an example disclosed track and hold circuit.

FIG. 3 is a schematic illustration of an example disclosed track and hold circuit 200. In general, the track and hold circuit 200 includes a first electronic switch 205 and a hold/buffer amplifier 207. For some implementations of the electronic switch 205, the track and hold circuit 200 may optionally include an averager 209. The first electronic switch 205 enables setting a mode of the track and hold circuit 200 to track mode or hold mode. The mode is controlled by a HOLD signal 210 provided to a first control input 215 of the electronic switch 205. The HOLD signal 210 may be provided by, for example, an analog-to-digital converter that controls the timing of the hold so that a voltage is held at the time the analog-to-digital converter is to convert the held signal from an analog signal to a digital signal. In the hold mode the electronic switch 205 is open, which disconnects a switch input 217 from a switch output 220. Thus, in hold mode, essentially nothing is coupled to the switch output 220 and the held voltage is unaffected. Conversely, in the track mode, the electronic switch 205 is closed and the input 217 of the track and hold circuit 200 is coupled to the switch output 220, which, in turn, is coupled to an input 225 of the hold/buffer amplifier 207. An output 230 of the track and hold circuit 200 is taken from the hold/buffer amplifier 207. Further details regarding the electronic switch 205, the hold/buffer amplifier 207, and the averager 209 are provided below.

Figure 4:
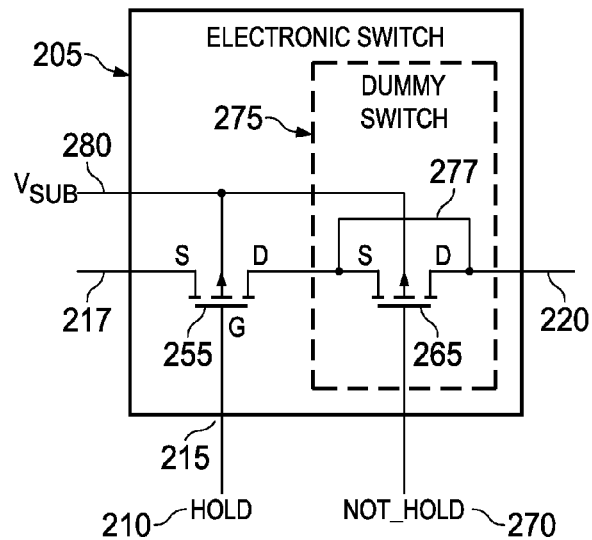
FIG. 4 is a schematic illustration of an example electronic switch, such as may be used to implement the electronic switch of FIG. 3.

An example electronic switch 205 is illustrated in FIG. 4. The example shown in FIG. 4, and, unless otherwise noted, all of the examples herein may be implemented using a 65 nanometer geometry CMOS process. Persons of ordinary skill in the art will appreciate that implementation could alternatively use other processes or a combination of processes as well as other device geometries than specified in the examples. In the illustrated example, the electronic switch 205 is provided with a first metal oxide semiconductor field effect transistor (MOSFET) 255 configured as an electronic switch and controlled by the voltage of the HOLD signal 210 applied to a gate of the first MOSFET 255. In one example implementation, the first MOSFET 255 is a p-channel MOSFET (PMOSFET) having a channel width of approximately 72 microns and a channel length of approximately 0.13 microns.

The electronic switch 205 of FIG. 4 also includes a second MOSFET 265 configured as an always-on dummy electronic switch 275 that is cascaded after the first MOSFET 255 and controlled by the voltage of a NOT_HOLD signal 270, which is a complemented HOLD signal 210. A drain and a source of the second MOSFET 265 are electrically shorted together with a shorting connection 277. In an example, the second MOSFET 265 is a PMOSFET having a channel width of approximately 36 microns and a channel length of approximately 0.13 microns. The primary purpose for the dummy electronic switch 275 created using the second MOSFET 265 and shorted connection 277 is to cancel an injected charge that occurs in the first MOSFET 255 due to parasitic capacitance when the HOLD signal 210 changes states (e.g., from a low state to a high state). Charge injection in a FET switch and cancellation of such using another FET is well known by persons of ordinary skill in the art, and thus, in the interest of brevity, will not be further explained here. Further, persons of ordinary skill in the art will appreciate that the dummy electronic switch 275 is optional. In other words, the dummy electronic switch 275 may be eliminated, and the output 220 of the electronic switch 205 taken from the drain of the first MOSFET 255.

Persons of ordinary skill in the art will appreciate that there are any number of alternative circuits that may be used to realize the electronic switch 205, e.g., n-channel MOSFETs (NMOSFETs) or other FETs may be used instead of PMOSFETs or a bipolar junction transistor circuit may be used. A PMOSFET is selected in the example illustrated in FIG. 4 because the PMOSFET provides better performance than an NMOSFET with the chosen CMOS process. Persons of ordinary skill in the art will appreciate that the NOT_HOLD signal 270 shown in FIG. 4 may be generated from the HOLD signal 210 in many alternative ways, e.g., an inverter gate internal to the electronic switch 205 or an inverter gate external to the electronic switch 205.

The illustrated example of FIG. 4 includes coupling substrates of the first and second MOSFETs 255 and 265 to a substrate bias signal $V_{SUB}$ 280 to affect the ON resistance of the MOSFETs 255 and 265. As is well known by persons of ordinary skill in the art, substrate voltage affects the channel ON resistance of a MOSFET. For a PMOSFET, higher substrate voltage corresponds to lower channel resistance. However, if the substrate voltage is too high relative to the voltages of source and drain, parasitic PN junctions in the PMOSFET structure start to become active and cause undesired behavior in the operation of the PMOSFET. Further, if the substrate voltage varies too quickly with time, the resulting modulation of the channel ON resistance may adversely affect operation of an electronic switch using a PMOSFET. As will be appreciated by persons of ordinary skill in the art, the substrate bias signal $V_{SUB}$ 280 could be functionally defined in any number of ways and these ways realized in any number of circuits, e.g., $V_{SUB}$ 280 may be sourced from a DC voltage and may be sourced from the lowest DC voltage of the track and hold circuit 200.

Returning briefly to FIG. 3, the substrate bias signal $V_{SUB}$ 280 of the example track and hold circuit 200 is generated by the averager 209, which receives its input from the input signal 217. The primary purpose of the example averager 209 is to extract a slowly varying average of the input signal 217 relative to a reference voltage 287 of the track and hold circuit 200 to allow the voltage of the substrate bias signal $V_{SUB}$ 280 to rise when the input signal 217 is, in the long term, at higher voltages. This strategy reduces the ON resistance of the MOSFETs (255 and 265, FIG. 4). In one example, the input signal 217 should have small enough high frequency amplitude variation to avoid activating parasitic PN junctions within the structures of the MOSFETs (255 and 265, FIG. 4).

Figure 5:
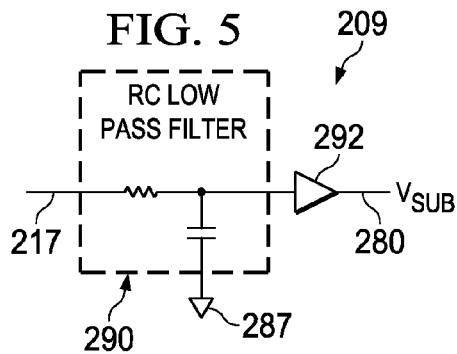
FIG. 5 is a schematic illustration of an example averager, such as may be used to implement the averager of FIG. 4.

An example averager 209 is schematically illustrated in FIG. 5. In the illustrated example, the input signal 217 of the track and hold circuit 200 is further provided to the averager 209, which includes an RC low pass filter 290 followed by a buffer amplifier 292. The buffer amplifier 292 isolates an output impedance of the RC low pass filter 290 from whatever load might be coupled to the substrate bias signal $V_{SUB}$ 280. The output of the buffer amplifier is the substrate bias signal $V_{SUB}$ 280. Persons of ordinary skill in the art will appreciate that the buffer amplifier 292 may optionally be omitted. To avoid the problems associated with varying the substrate voltage too quickly, the 3 decibel (dB) corner frequency of the RC low pass filter 290 may be selected to be 6 or so orders of magnitude below the sample rate of the track and hold circuit 200. For example, if the sample rate of the track and hold circuit 200 is 6.25 GHz, the corner frequency of the RC low pass filter 290 may be approximately 6.25 kilohertz (KHz). In one example, the RC low pass filter 290 is a first order RC passive filter. However, low pass filters are well known to persons of ordinary skill in the art, and such persons will appreciate that there are any number of filter circuits that may be employed alternatively in the averager 209, e.g., a higher order filter, an active filter, a non-linear filter, and various combinations of these.

Returning briefly to FIG. 3, in the track and hold circuit 200, the output 220 of the first electronic switch 205 is provided to an input 225 of a hold/buffer amplifier 207. The purpose of the hold/buffer amplifier 207 is to hold onto a voltage value of the input signal 217 of the track and hold circuit 200 when the electronic switch 205 is open, to track the input signal 225 of the track and hold 200 when the electronic switch 205 is closed, and to buffer the tracked and/or held signal so it can be provided to a range of different devices that may be coupled to the output 230 of the hold/buffer amplifier 207.

Figure 6:
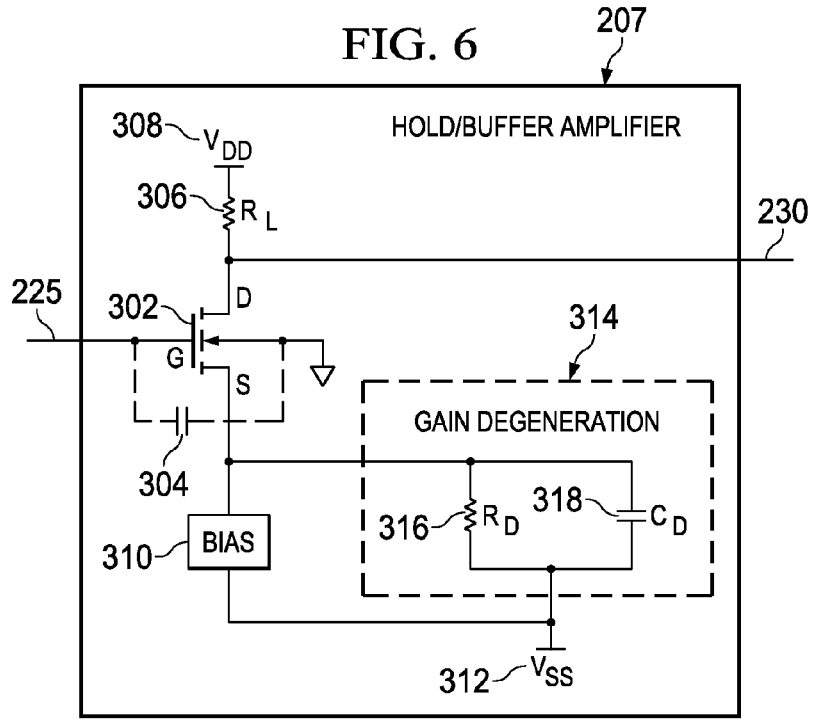
FIG. 6 is a schematic illustration of an example hold/buffer amplifier for use in a track and hold circuit, such as the hold/buffer amplifier of FIG. 3.

FIG. 6 is a schematic illustration of an example disclosed hold/buffer amplifier 207. For the purpose of storing a voltage of an input signal 225 of the hold/buffer amplifier 207 and also for buffering the voltage tracked and/or held, the hold/buffer amplifier 207 includes a MOSFET 302. The MOSFET 302 of the example of FIG. 6 is an NMOSFET having a channel width of approximately 80 microns and a channel length of approximately 0.09 microns. However, persons of ordinary skill in the art will appreciate that, in certain cases, a PMOSFET may be used instead of an NMOSFET. In the example, an NMOSFET is used for the MOSFET 302 because an NMOSFET provides better performance in the hold/buffer amplifier 207 than a PMOSFET using the chosen CMOS process.

Continuing with the description of the hold/buffer amplifier 207 of FIG. 6, a capacitor 304 is a parasitic capacitance between a gate and a substrate of the MOSFET 302. To indicate this, FIG. 6 shows the connections to the parasitic capacitor 304 with dashed lines. The capacitor 304 is described as a parasitic capacitance because in typical MOSFET manufacturing and use, the presence of this parasitic capacitance is not primary, and in many if not most MOSFET applications, this parasitic capacitance is an undesired attribute of the MOSFET. In the illustrated example, the capacitor 304 provides a dominant hold capacitance for the track and hold circuit 200, i.e., any other holding capacitance for holding the voltage of the first input signal 225, whether in the hold/buffer amplifier 207 or elsewhere in the track and hold circuit 200, is less than the capacitance provided by the capacitor 304. Multiple hold capacitances in a track and hold circuit increase the total hold capacitance. Therefore, by providing a small, but dominant hold capacitance, i.e., parasitic capacitor 304, the total hold capacitance of the track and hold circuit 200 can be made small. A small total holding capacitance in the track and hold circuit 200 is useful because a charging time of the total hold capacitance is reduced when the total hold capacitance is reduced. As mentioned above, the charging time of the hold capacitance limits the maximum sample rate of a track and hold circuit (such as the track and hold circuit 200).

The MOSFET 302 also allows for buffer amplification of a voltage of the input signal 225, with the output 230 taken from the drain of the MOSFET 302. In the illustrated example, a resistor $R_L$ 306 is coupled between a drain of the MOSFET 302 and a supplied voltage $V_{DD}$ 308. In one example, the resistor $R_L$ 306 is implemented with passive resistor technology. The purpose for using passive resistor technology is that passive resistor technology allows a smaller resistance value than active resistor technology, which, in turn, allows a smaller possible voltage $V_{DD}$ 308. A smaller possible voltage $V_{DD}$ 308 is a benefit for some applications (e.g. lower power requirements, less heat generation, less costly circuitry).

The resistance value selected for resistor $R_L$ 306 is approximately 25 Ohms. This value selection is based on many conditions imposed by the specific CMOS technology employed and application specific requirements (e.g., constraints on the voltage of the output of the track and hold circuit 200 of FIG. 3 and constraints on the power consumption of the track and hold circuit 200. Persons of ordinary skill in the art will appreciate that other values for $R_L$ 306 may be used. An active bias circuit 310 is coupled between a source of the MOSFET 302 and a second supplied voltage $V_{SS}$ 312 for the primary purpose of setting an operating point current for the MOSFET 302. With the MOSFET 302 configured as described, a voltage at the drain of the MOSFET 302 is an amplified and buffered analog of the voltage appearing on the gate of the MOSFET 302. Persons of ordinary skill in the art will appreciate that there are many other ways that the MOSFET 302 may be configured to provide buffer amplification. For example, rather than using the passive resistor for $R_L$ 306, an active CMOS resistance may be coupled between the drain of the MOSFET 302 and the first supplied voltage $V_{DD}$ 308. In another example, a passive bias circuit may be used instead of the active bias circuit 310.

To control the voltage gain provided by the MOSFET 302 from gate to drain, the hold/buffer amplifier 207 includes a gain degeneration circuit 314 coupled between the source of the MOSFET 302 and the second supplied voltage $V_{SS}$ 312. An example gain degeneration circuit 314 is shown in FIG. 6. A resistor $R_D$ 316 is coupled in parallel with a capacitor $C_D$ 318. The resistance value of $R_D$ 316 affects the low frequency voltage gain of the hold/buffer amplifier 207 and the values of both $R_D$ 316 and $C_D$ 318, together, affect the corner frequency above which the voltage gain tends to increase with increasing frequency for the purpose of counteracting the gain falloff with frequency that typically occurs with this type of buffer amplification. With an appropriate tuning of the $R_D$ 316 and $C_D$ 318 values, the settling time of the hold/buffer amplifier 207 can be minimized and, thus, the sample rate maximized. In one example, the resistance value selected for $R_D$ 316 is approximately 15 Ohms and the capacitance value selected for $C_D$ 318 is approximately 5 picofarads (pF). Persons of ordinary skill in the art will appreciate that other values for $R_D$ 316 and $C_D$ 318 may be appropriate and that there are many other gain degeneration circuits that may be used instead of the gain degeneration circuit 314.

An important feature that enables the present embodiment to operate at speeds over 6 GHz is the use of the gate capacitance as storage capacitor for the track & hold function. The gate capacitance plus the "passive" metal routing accounts for more than half of the capacitances which exist on the sampling nodes (for instance 85 fF over a total of 128.5 fF), making it dominant. Any other signal which would eventually couple to the node through the remaining capacitors associated with the node (the remaining 43.5 fF in this example) would be attenuated by the parasitic capacitive divider.

One aspect of the invention lies in realising the tradeoff between gate capacitance, which is broadly proportional to the product of transistor dimensions, and beta, which is proportional to their ratio. These dimensions may be trimmed by selecting geometry parameters like number of fingers/devices and interconnection spaces.

Also at the heart of performance in high speed application is the balance between the size of the switch (255) and the capacitance afforded by the gate of transistor (302) plus the metal etc. capacitance (304) as mentioned above.

Given a maximum amplitude of the input signal $V_{pp}$, the differential charge $Q_d$ injected into the sample node is proportional to $V_{pp}$ with half the gate capacitance of the switch (working under the hypothesis that the charge is equally injected into drain and source when the switch is opened). A part of it, $\alpha$, will be cancelled by the charge canceller device (265) if present. If the charge canceller is not present $\alpha=1$.

The condition, to which the designer has to design, is that:

$$\alpha \cdot Qd < 2^{-(n+1)} V_{pp}(C_{gate}+C_{metal})$$

where n is the accuracy in number of bits that the system will achieve.

In essence, we are constraining the noise to be small enough to be undetectable by the system. In conclusion, Qd is proportional to the gate capacitance of the switch which is proportional to the product of its dimensions, and the same applies to the gate capacitance of the amplifier transistor 302 plus the metal capacitinace contributing to storage capacitor 304.

On the other side of the tradeoff is the bandwidth of the signal that can be acquired: an excess of capacitance on the sampling node will result in a "filtering action" that will reduce the bandwidth.

Figure 7:
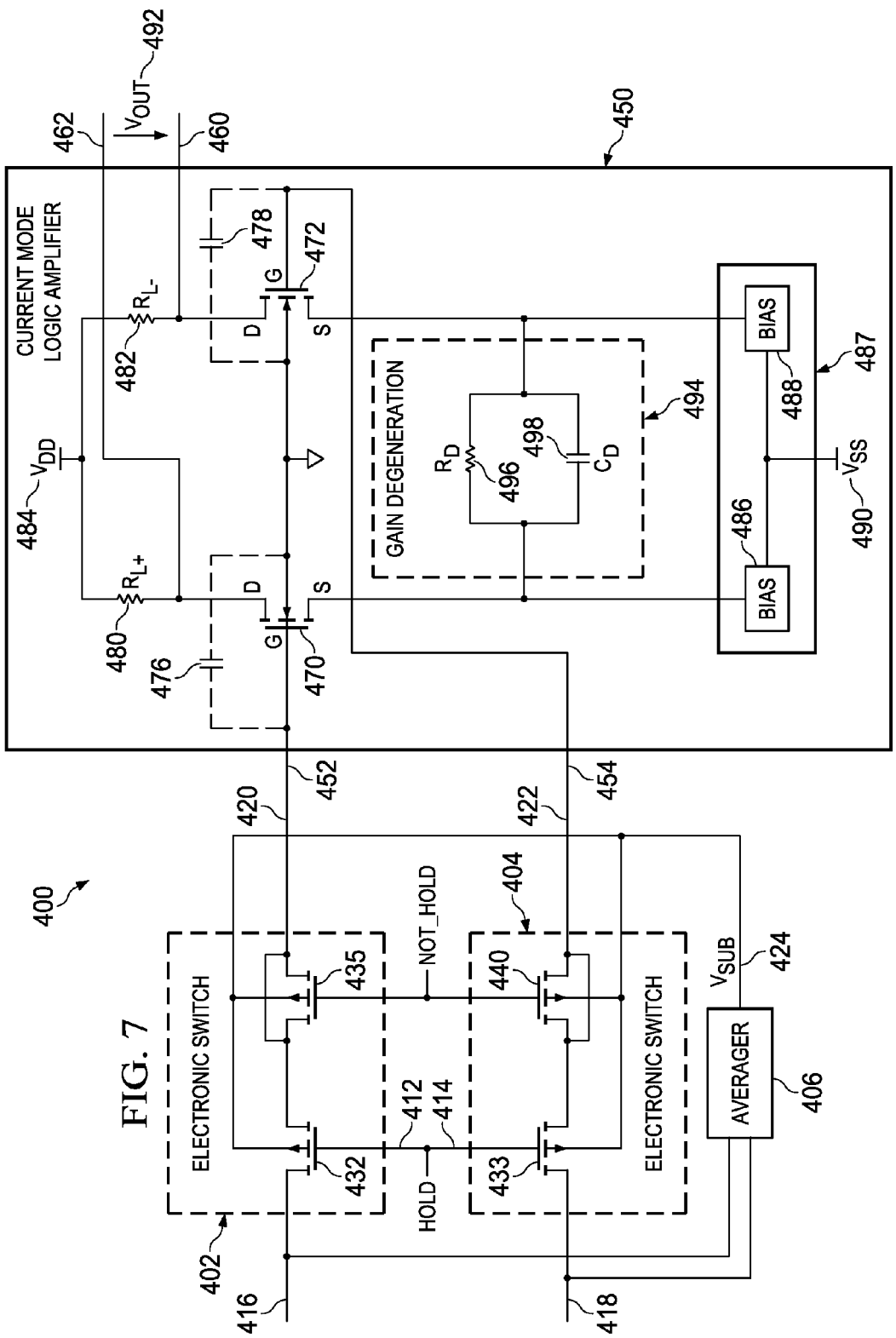
FIG. 7 is a schematic illustration of an example differential track and hold circuit.

FIG. 7 is a schematic illustration of an example differential track and hold circuit 400. The differential track and hold circuit 400 is similar in conceptual functionality to the track and hold circuit 200 (of FIG. 3), but operates in a differential manner. Persons of ordinary skill in the art will appreciate that a differential circuit structure may provide an improved signal quality when compared to a single-ended structure. In general, the track and hold circuit 400 includes a first electronic switch 402, a second electronic switch 404, and a current mode logic amplifier 450. For some implementations of the first and second electronic switches 402 and 404, the track and hold circuit 400 may optionally include an averager 406. The first and second electronic switches 402 and 404 enable setting a mode of the track and hold circuit 400 to track mode or to hold mode. The mode is controlled by a HOLD signal 410 provided to a control input 412 of the first electronic switch 402 and to a control input 414 of the second electronic switch 404. In the hold mode the first and second electronic switches 402 and 404 are open, which disconnects a first input signal 416 of the differential track and hold circuit 400 from a switch output 420 of the first electronic switch 402 and which also disconnects a second input signal 418 of the differential track and hold circuit 400 from a switch output 422 of the second electronic switch 404. Thus, in the hold mode, the switches 402 and 404 are both open and essentially nothing is coupled to first and second switch outputs 420 and 422. Conversely, in the track mode, the first and second electronic switches 402 and 404 are closed and the first and second input signals 416 and 418 of the differential track and hold circuit are coupled to the switch outputs 420 and 422, respectively, which, in turn, are coupled, respectively, to a first input 452 and a second input 454 of the current mode logic amplifier 450. Further details regarding the first and second electronic switches 402 and 404, the current mode logic amplifier 450, and the averager 209 are provided below.

An example implementation of the first and second electronic switches 402 and 404 is shown in FIG. 7. Each of the first and second switches 402 and 404 is similar or identical to the switch 205 illustrated in FIG. 4 for the single-ended track and hold circuit 200, and all of the discussion above about switch 205 in FIG. 4 apply to the first and second electronic switches 402 and 404 shown in FIG. 7. This includes the discussion on alternate realizations for the switch 205.

Figure 8:
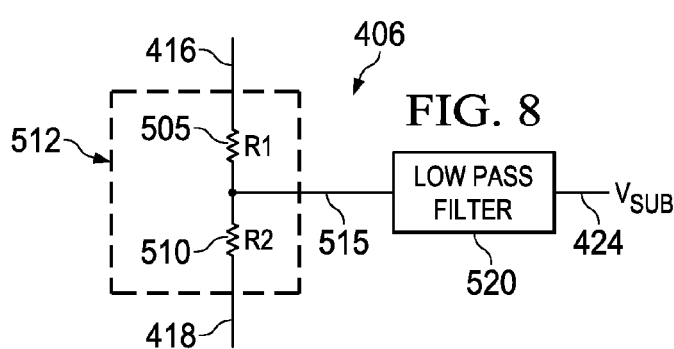
FIG. 8 is a schematic illustration of an example averager, such as may be used in the example differential track and hold circuit of FIG. 7.

In the illustrated example shown in FIG. 7, a substrate bias signal $V_{SUB}$ 424 is generated by the averager 406 applied to the first and second input signals 416 and 418 of the differential track and hold circuit 400. The substrate bias signal $V_{SUB}$ 424 is coupled to substrates of four MOSFETs 432, 433, 435, and 440. An example averager 406 is schematically illustrated in FIG. 8. In the illustrated example, R1 505 and R2 510 form a resistance divider 512 between the first and second inputs 416 and 418 of the differential track and hold circuit 400 of FIG. 7. An output 515 of the resistance divider 512 is coupled from the common connection of R1 505 and R2 510. For the purpose of extracting a common-mode component of the first and second input signals 416 and 418, the resistance values of R1 505 and R2 510 of the resistance divider 512 are chosen to be substantially equal. The output 515 of the resistance divider 512 is coupled to a low pass filter 520. The output of the low pass filter 520 is the substrate bias signal $V_{SUB}$ 424. The primary purpose of using a common-mode component of the two input signals 416 and 418 is to allow the voltage of the substrate bias signal $V_{SUB}$ 424 to rise when the common-mode component is high in order to reduce the ON resistance of the MOSFETs (432, 433, 435, and 440, FIG. 7). In one example, the first and second input signals 416 and 418 should have small enough high frequency amplitude variation to avoid activating parasitic PN junctions within the structures of the MOSFETs (432, 433, 435, and 440, FIG. 7).

The purpose of the low pass filter 520 is to attenuate any high frequencies in the output 515 of the resistance divider 512. To avoid the problems associated with varying the substrate voltage too quickly, the 3 dB corner frequency of the low pass filter 520 may be selected to be 6 or so orders of magnitude below the sample rate of the differential track and hold circuit 400. The sample rate of the differential track and hold circuit 400 of FIG. 7 may be, for example, 6.25 GHz and the corner frequency of the low pass filter 520 may be, for example, 6.25 KHz. Persons of ordinary skill in the art will appreciate that there are many other ways to extract a common-mode component or other average of the first and second input signals 416 and 418, e.g., an impedance divider, active summation, different filters, etc. In an example variation of the averager 406, the low pass filter 520 is omitted and the output 515 of the resistance divider 512 is the substrate bias signal $V_{SUB}$ 424. This can be done in an application in which the first and second input signals 416 and 418 are already constrained so that their common-mode component meets strict requirements limiting high frequency content. This is the situation, for example, when the first and second signal inputs 416 and 418 comply with the Optical Internetworking Forum's Implementation Agreement OIF-CEI-02.0, which has a title "IA Title: Common Electrical I/O (CEI)—Electrical and Jitter Interoperability agreements for 6G+ bps and 11G+ bps I/O." The particular relevant sections of this agreement are section 3.2.2, section 9.2.2, and section 9.3. In other words, persons of ordinary skill in the art will appreciate that the low pass filter 520 may be optionally eliminated.

Returning to FIG. 7, in the differential track and hold circuit 400, the purpose of the current mode logic amplifier 450 is to hold onto the voltage values of the first and second input signals 416 and 418 of the differential track and hold circuit 400 when the electronic switches 402 and 404 are open, to track the first and second input signals 416 and 418 of the differential track and hold 400 when the electronic switches 402 and 404 are closed, and to buffer the tracked and/or held signals so they can be provided to a range of different devices that may be coupled to a first output 460 and a second output 462 of the current mode logic amplifier 450.

An example current mode logic amplifier 450 is shown in FIG. 7. The current mode logic amplifier 450 has many similarities to the single ended hold/buffer amplifier 207 illustrated in FIG. 6. However, the current mode logic amplifier 450 has a differential structure that is appropriate for use with the differential track and hold circuit 400. The current mode logic amplifier 450 includes a first MOSFET 470 having a gate coupled to the first input signal 452 of the current mode logic amplifier 450 and a second MOSFET 472 having a gate coupled to the second input signal 454 of the current mode logic amplifier 450. In one example, the MOSFETs 470 and 472 are NMOSFETs each having a channel width of approximately 80 microns and a channel length of approximately 0.09 microns. NMOSFETs are used for MOSFETs 470 and 472 in the illustrated example because NMOSFETs provide better performance in the current mode logic amplifier 450 than PMOSFETs using the chosen CMOS process. However, persons of ordinary skill in the art will appreciate that, in certain cases, PMOSFETs may be used instead of NMOSFETs.

Continuing with the description of the current mode logic amplifier 450 in FIG. 7, a first capacitor 476 and a second capacitor 478 are each a parasitic capacitance between a gate and a substrate for each of the MOSFETs 470 and 472. To indicate this, FIG. 7 shows the connections to the capacitors 476 and 478 with dashed lines. The first capacitor 476 provides a first dominant hold capacitance for the differential track and hold circuit 400, i.e., any other holding capacitance for holding the voltage of the first input signal 452, whether in the current mode logic amplifier 450 or elsewhere in the differential track and hold circuit 400, is less than the capacitance provided by the first capacitor 476. The second capacitor 478 provides a second dominant hold capacitance for the differential track and hold circuit 400, i.e., any other holding capacitance for holding the voltage of the second input signal 454, whether in the current mode logic amplifier 450 or elsewhere in the differential track and hold circuit 400, is less than the capacitance provided by the second capacitor 478. Therefore, with this design, the total hold capacitances of the differential track and hold circuit 400 for each side of differential signal can be small. This is useful because the charging time of the hold capacitance is reduced when the hold capacitance is reduced. As mentioned above, charging time limits the sample rate of the differential track and hold circuit 400.

The MOSFETs 470 and 472 also allow for differential buffer amplification of a voltage difference between the first and second input signals 452 and 454 of the current mode logic amplifier 450. In the illustrated example, a resistor $R_{L+}$ 480 is coupled between a drain of the first MOSFET 470 and a first supplied voltage $V_{DD}$ 484 and a resistor $R_{L-}$ 482 is coupled between a drain of the second MOSFET 472 and the first supplied voltage $V_{DD}$ 484. Resistors $R_{L+}$ 480 and $R_{L-}$ 482 are implemented with passive resistor technology. The purpose for using passive resistor technology is that passive resistor technology allows a smaller resistance value than active resistor technology, which, in turn, allows a smaller possible voltage $V_{DD}$ 484. A smaller possible voltage $V_{DD}$ 484 is a benefit for some applications (e.g. lower power requirements, less heat generation, less costly circuitry). The resistance values selected for resistors $R_{L+}$ 480 and $R_{L-}$ 482 are approximately 25 Ohms each. The selection of the values of resistors $R_{L+}$ 480 and $R_{L-}$ 482 involves similar or identical considerations as described above about the selection of the resistance value for $R_L$ 306 in the example hold/buffer amplifier 207 of FIG. 6. A first active bias circuit 486 is coupled between the source of the first MOSFET 470 and a second supplied voltage $V_{SS}$ 490 for the primary purpose of setting an operating point current for the first MOSFET 470. A second active bias circuit 488 is coupled between the source of the second MOSFET 472 and the second supplied voltage $V_{SS}$ 490 for the primary purpose of setting an operating point current for the second MOSFET 472. In the illustrated example, the active bias circuits 486 and 488 generate substantially equal operating point currents in the MOSFETs 470 and 472. Alternatively, a bias circuit 487 may provide a common bias point (e.g., from a single bias circuit such as the bias circuit 486) coupled to both of the sources of the first and second MOSFETs 470 and 472, if some form of isolation is provided between the common bias point and at least one of the sources f the first and second MOSFETs 470 and/or 472. With the MOSFETs 470 and 472 configured as described, a differential voltage $V_{OUT}$ 492 between the drains of the MOSFETs 470 and 472 is an amplified and buffered analog of the difference voltage between the first and second input signals 452 and 454. Persons of ordinary skill in the art will appreciate that there are many other ways that the MOSFETs 470 and 472 may be configured to provide differential buffer amplification. For example, rather than using the passive technology for resistors $R_{L+}$ 480 and $R_{L-}$ 482, the resistors $R_{L+}$ 480 and $R_{L-}$ 482 may be implemented with active circuitry. In another example, passive bias circuits may be used instead of the active bias circuits 486 and 488.

To control the voltage gain of the differential buffer amplification provided by the MOSFETs 470 and 472, the current mode logic amplifier 450 includes a gain degeneration circuit 494 coupled between the source of the MOSFET 470 and the source of the MOSFET 472. A resistor $R_D$ 496 is coupled in parallel with a capacitor $C_D$ 498. The value of $R_D$ 496 affects the low frequency differential voltage gain of the current mode logic amplifier 450 and the values of both $R_D$ 496 and $C_D$ 498, together, affect the corner frequency above which the voltage gain tends to increase with increasing frequency for the purpose of counteracting the gain falloff with frequency that typically occurs with this type of buffer amplification. With an appropriate tuning of the $R_D$ 496 and $C_D$ 498 resistance values, the settling time of the current mode logic amplifier 450 can be minimized and, thus, the sample rate of the differential track and hold circuit 400 can be maximized. In one example, the resistance value selected for $R_D$ 496 is approximately 15 Ohms and the capacitance value selected for $C_D$ 498 is approximately 5 pF. Persons of ordinary skill in the art will appreciate that any number of other values for $R_D$ 496 and $C_D$ 498 may be appropriate and that there are many other gain degeneration circuits that may be used instead of the gain degeneration circuit 494.

In one example of the differential track and hold circuit 400 illustrated in FIG. 7, the differential track and hold has a sample rate of 6.25 GHz, the supply voltage VDD 484 is approximately 0.85 Volts to 1.1 Volts, the supply voltage VSS 490 is 0 Volts, and the differential voltage on the input signals 416 and 418 has a swing of approximately 1.2 differential peak-peak Volts. Persons of ordinary skill in the art will appreciate that other sample rates, supply voltages and input signal levels may be selected.

It will be realised that the comments regarding use if the gate capacitance of transistors 470 and 472 as the dominant storage mechanism as described above with respect to the single ended arrangement. Moreover, the balance between the switch dimensions, transistors 432 and 433 (together with any charge cancellation) and the amplifier transistors 470 and 472 also as described above is important for operation at high speed.

Figure 9:
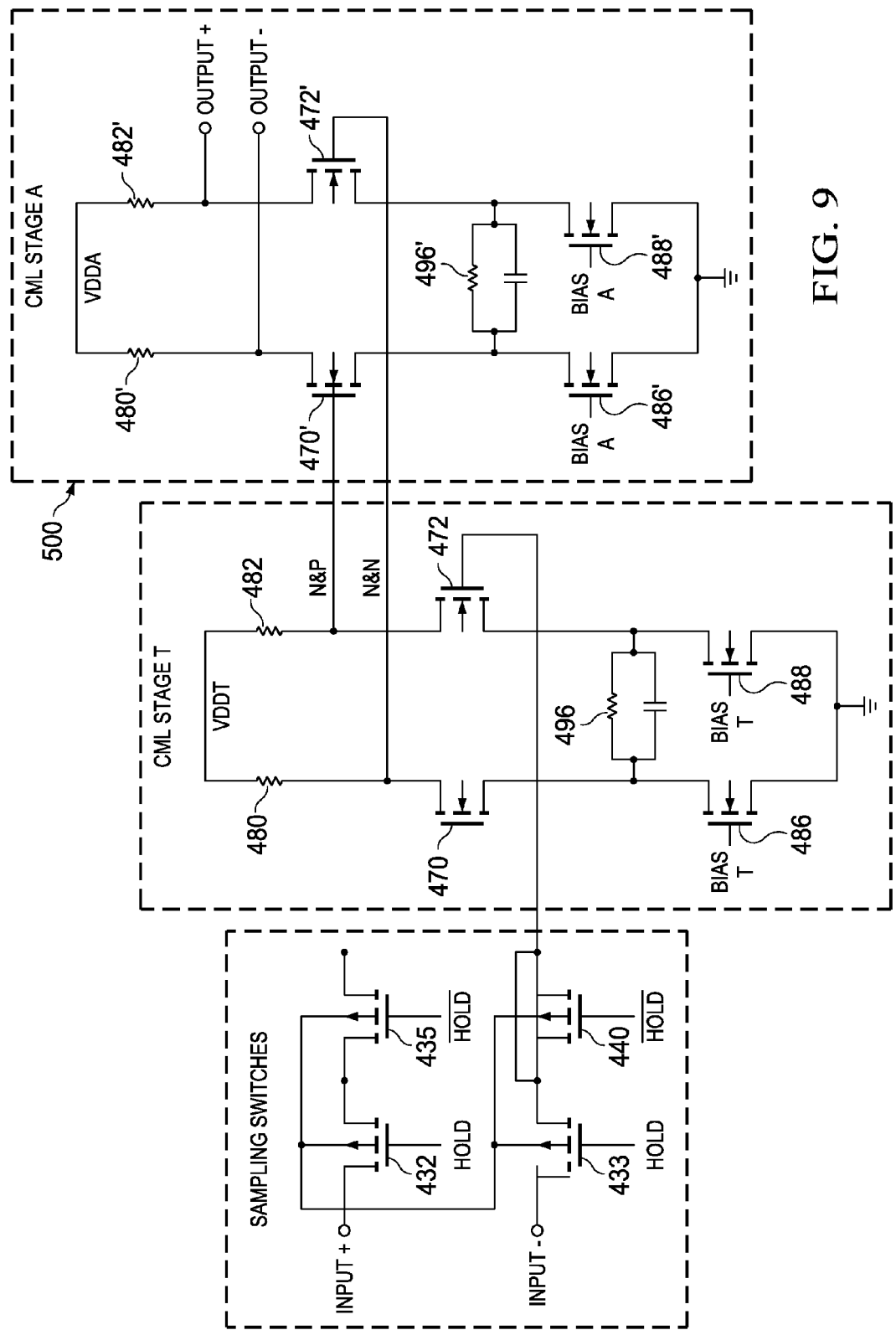
FIG. 9 represent a further embodiment of the present invention.

In a further embodiment of a differential arrangement it has been found advantageous the employ a staged output amplifier for example as a tapered chain of stages. The transistors of the first stage provide the storage function as hereinbefore described. The arrangement is shown in FIG. 9 wherein, for parts of equivalent function to those of FIG. 7, common reference numerals have been used. It will be appreciated however the actual devices used to realise the circuit of FIG. 9 may not be the same as FIG. 7 since staging of the amplifier permits the balance of the switching transistors 432, 433 with the respective storage transistors 470,472 to be improved since the gain requirement can be spread over the stages. In particular the gate capacitance can be reduced. Accordingly, a second current mode logic amplifier 500 is provided comprising transistors 470' and 472', load resistors 480' and 482', together with degeneration block 496'.

Generally speaking in single stage circuit such as that of FIG. 7, the larger the amplifier, the larger is the switch required and hence the more charge injected, this requires more storage capacitance which results in a slower sampling rate. In the two stage circuit of the present embodiment, this linkage can be broken since the size of the input transistor of the first CML may be reduced. The smaller capacitance of such a transistor requires a smaller switch with less inherent charge injection upon switching.

There is an analytical method to balance the transfer characteristics and therefore the geometrical and electrical parameters of a tapered chain of amplifiers. This is done by working back from the output of the chain, defining the transconductance of each stage by assuming that the bandwidth of the stage is the ratio of the transconductance and the capacitance at its output. On the other side of the constraint the designer will find the maximum power consumption allowed in the system. The benefit of this technique will be reflected at the input of the stage, where the input capacitance will be reduced (allowing for high bandwidth signals to be acquired). In FIG. 9 there are two stages in the chain although in alternative arrangement three or more could be used to the same effect.

The stages are biased by transistors 486 and 488 and 486' and 488' respectively. If a common bias is used, the common mode level of the output is the same as would have been provided by a single stage arrangement. However, the chain of amplifiers allows level shifting of the common mode: each stage introduces a quantifiable freedom to shift the common mode. This feature depends on the supply voltage at which the circuit operates and on technology parameters. The use of this feature may be in adaptive voltage scaling application. e.g. to keep the supply voltage of the following stage low to save on power. With this technique one is able to adjust the common mode at the output of the chain of the amplifier so that it matches the requirements of the following stage.

Figure 10:
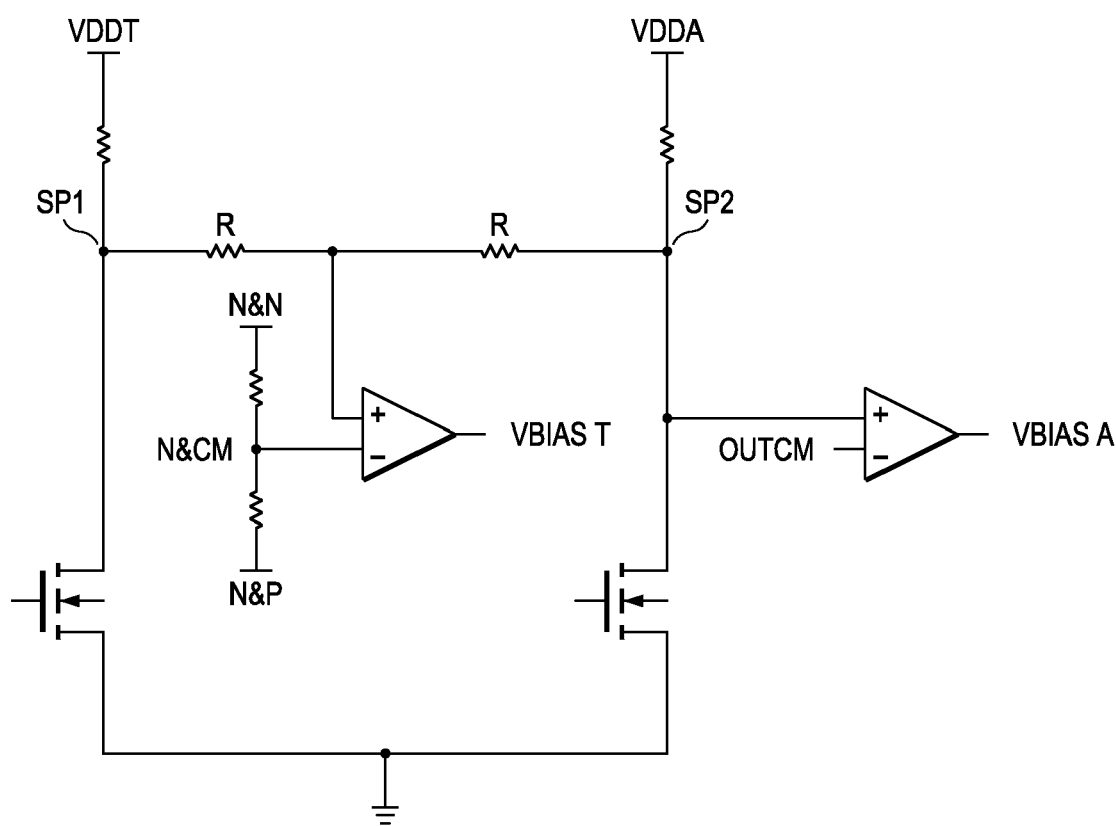
FIG. 10 represent a bias circuit

The bias circuit shown in FIG. 10 comprehends two continuous time common mode feedback circuit. A resistive network provides the set-points for both stages. The set-point at the second stage reflects the requirement of the following stage in the application (e.g. VDDA-275 mV). The first set point SP1 is set as the average between the input common mode voltage (for example VDDT-175 mV) and the common mode voltage of the second stage. In essence, the shifted average of two different supply voltages is present at SP1, yielding best performance of the cascade of the amplifier. In fact, the headroom and static range of the amplifier is maximized by this method.

The concept can be extended to a chain of N amplifiers, where at each stage the common mode is for example the N-th part of the shift between input and output common mode voltages.

Although certain example circuits have been described herein, the scope of coverage of this patent is not limited thereto. On the contrary, this patent covers all apparatus fairly falling within the scope of the appended claims either literally or under the doctrine of equivalents.

What is claimed is:

1. A track and hold circuit for providing a signal to be quantized to a number of bits comprising:
    an electronic switch wherein an input of said electronic switch is selectively transmitted to an output of said electronic switch based on a control signal applied to the electronic switch; and
    a current mode logic amplifier including an input coupled to the output of the electronic switch, the current mode logic amplifier including an input transistor providing a storage capacitance such that when said electronic switch disconnects a signal; at said input the last voltage of said signal is stored by said capacitance;
    the electronic switch and the input transistor being arranged such that charge injected by the electronic switch upon a change of state is equivalent to a voltage representing less than half a single bit of quantisation.
    wherein said common mode logic amplifier comprises a plurality of stages.

2. The track and hold circuit of claim 1 wherein said common mode logic amplifier comprises two stages.

3. The track and hold circuit of claim 1 wherein each stage of the common mode logic amplifier is provided with bias different from another stage.

4. The track and hold circuit of claim 1, wherein the plurality of stages allows level shifting of an associated common mode.

5. The track and hold circuit of claim 1, wherein each of the plurality of stages introduces a quantifiable freedom of shifting an associated common mode.

6. The track and hold circuit of claim 5, wherein the track and hold circuit can adjust the associated common mode at the output so that it matches a previous stage.

* * * * *

UNITED STATES PATENT AND TRADEMARK OFFICE
CERTIFICATE OF CORRECTION

PATENT NO. : 7,847,600 B2  
APPLICATION NO. : 12/198355  
DATED : December 7, 2010  
INVENTOR(S) : Thomas Leslie, Antonio David Sebastio and Bhajan Singh Page 1 of 1

It is certified that error appears in the above-identified patent and that said Letters Patent is hereby corrected as shown below:

Title Page Item (60) should read:  
Provisional Application No. 61/016,999, filed on December 27, 2007.

Signed and Sealed this  
Tenth Day of April, 2012

David J. Kappos  
*Director of the United States Patent and Trademark Office*